United States Patent
Sellers

(10) Patent No.: US 7,309,988 B2
(45) Date of Patent: Dec. 18, 2007

(54) METHODS AND SYSTEMS FOR REDUCING ACOUSTIC NOISE IN A MAGNETIC RESONANCE IMAGING (MRI) SYSTEM

(75) Inventor: Michael Ben Sellers, Florence, SC (US)

(73) Assignee: General Electric Company, Schenectady, NY (US)

( * ) Notice: Subject to any disclaimer, the term of this patent is extended or adjusted under 35 U.S.C. 154(b) by 88 days.

(21) Appl. No.: 11/330,667

(22) Filed: Jan. 12, 2006

(65) Prior Publication Data

US 2007/0159169 A1    Jul. 12, 2007

(51) Int. Cl.
*G01V 3/00* (2006.01)

(52) U.S. Cl. .................... 324/318; 324/322

(58) Field of Classification Search ........ 324/300–322; 600/410–445
See application file for complete search history.

(56) References Cited

U.S. PATENT DOCUMENTS

| | | | | |
|---|---|---|---|---|
| 5,022,272 A | * | 6/1991 | Bronowicki et al. | 73/772 |
| 5,525,853 A | * | 6/1996 | Nye et al. | 310/316.01 |
| 5,617,026 A | * | 4/1997 | Yoshino et al. | 324/318 |
| 5,645,260 A | * | 7/1997 | Falangas | 248/550 |
| 6,082,719 A | * | 7/2000 | Shtarkman et al. | 267/140.14 |
| 6,191,519 B1 | * | 2/2001 | Nye et al. | 310/316.01 |
| 6,252,334 B1 | * | 6/2001 | Nye et al. | 310/328 |
| 6,396,272 B1 | * | 5/2002 | Dietz et al. | 324/318 |
| 6,518,761 B2 | * | 2/2003 | Roozen et al. | 324/318 |
| 6,519,343 B1 | | 2/2003 | Mansfield | |
| 6,552,543 B1 | * | 4/2003 | Dietz | 324/318 |
| 6,636,041 B2 | * | 10/2003 | Arz et al. | 324/322 |
| 7,202,667 B2 | * | 4/2007 | Barbic | 324/318 |

* cited by examiner

*Primary Examiner*—Brij Shrivastav
(74) *Attorney, Agent, or Firm*—The Small Patent Law Group; Dean D. Small

(57) ABSTRACT

A method for reducing acoustic noise in a medical imaging system is described. The method includes attaching a material to an area affected by an acoustic noise generated by the imaging system. The material is configured to bend upon receiving an electrical signal.

20 Claims, 4 Drawing Sheets

METHODS AND SYSTEMS FOR REDUCING ACOUSTIC NOISE IN A MAGNETIC RESONANCE IMAGING (MRI) SYSTEM

BACKGROUND OF THE INVENTION

This invention relates generally to medical imaging systems, and more particularly, to methods and systems for reducing acoustic noise in a Magnetic Resonance Imaging (MRI) system.

High magnetic field strength generated by a main magnet and high-speed gradient coil current switching are becoming common in MRI scanners. An interaction of the magnetic field and the current results in vibrations of a gradient coil. The vibrations of the gradient coil, and their support structure in the MRI system, create sound waves. High acoustic Sound Pressure Levels (SPLs) are created in and around the MRI systems due to these sound waves. The quest to produce high-quality images with very fast scan times results in the acoustic noise being of a substantially high level.

In the present state of the technology, various methods are used to reduce the SPLs heard by the patient during MRI scans. Disposable earplugs, headphones, noise-canceling systems, and special earphones for the patient are generally recommended in high magnetic field systems.

BRIEF DESCRIPTION OF THE INVENTION

In an exemplary embodiment of the invention, a method for reducing acoustic noise in a medical imaging system is described. The method includes attaching a material to an area affected by an acoustic noise generated by the imaging system. The material is configured to bend upon receiving an electrical signal.

In another exemplary embodiment, a system for reducing acoustic noise is described. The system includes a material configured to bend upon receiving an electric signal and attached to an area that receives an acoustic noise generated by a gradient coil of an imaging system. The material is configured to bend upon receiving an electrical signal.

DETAILED DESCRIPTION OF THE INVENTION

Various embodiments of the invention provide a method and a system to reduce acoustic noise in a Magnetic Resonance Imaging (MRI) system. Specifically, various embodiments of the invention provide a method and a system for attaching a bending material to an area, such as a plurality of parts, in the MRI system that generates the acoustic noise.

In various embodiments of the invention, the material may be a multimorph piezoelectric material. The multimorph piezoelectric material includes bimorph or trimorph piezoelectric crystals. Further, the multimorph piezoelectric material may be made of non-ferromagnetic material such as quartz, barium titanate, lead niobate, lead zirconate titanate and so forth.

Figure 1:
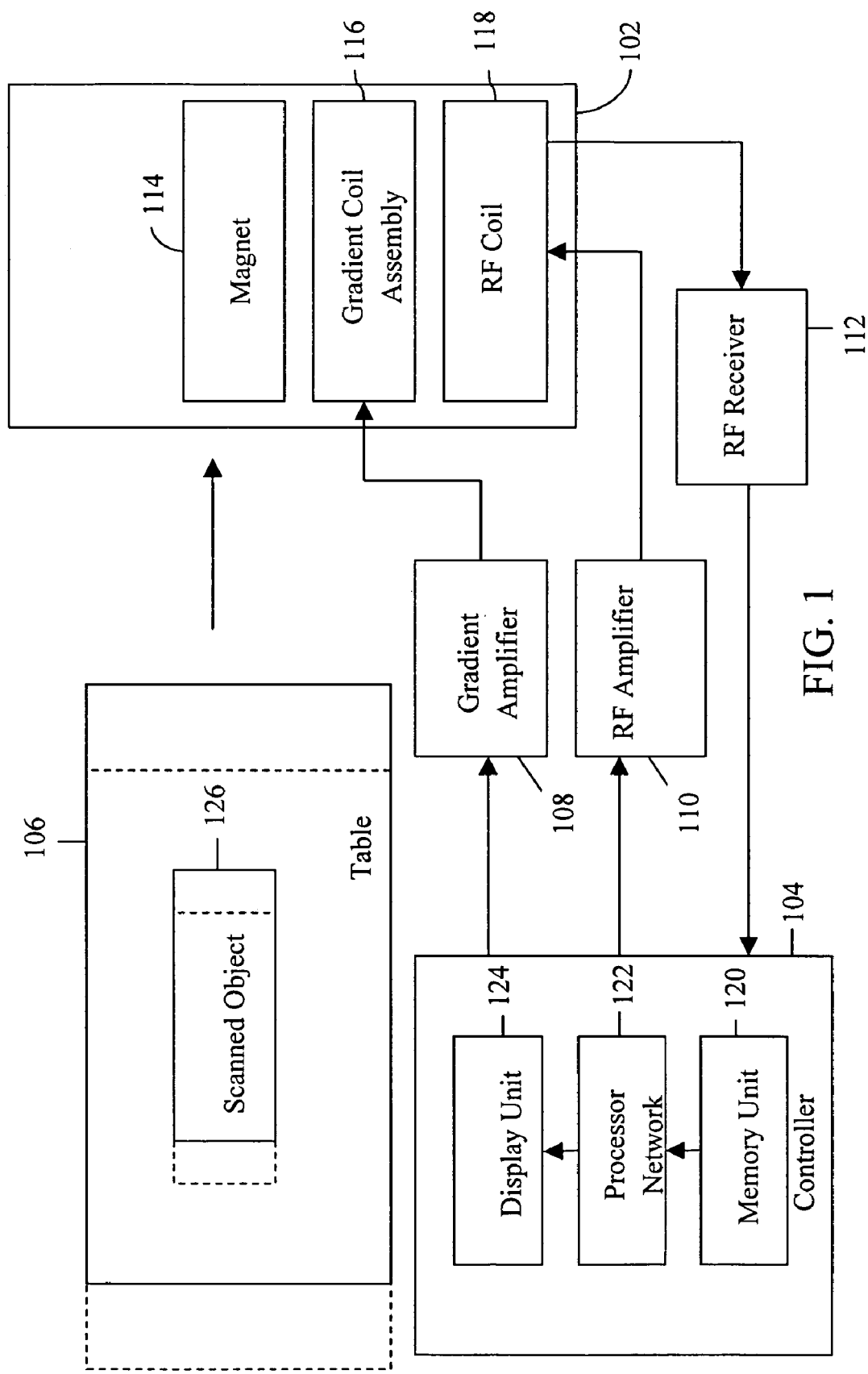
FIG. 1 is a block diagram of an MRI system, in accordance with an embodiment of the invention.

FIG. 1 is a block diagram of an MRI system 100, in accordance with an embodiment of the invention. MRI system 100 generally includes a scan portion 102, a controller 104, a table 106, a gradient amplifier 108, a Radio Frequency (RF) amplifier 110, and an RF receiver 112. Scan portion 102 includes a magnet 114, a gradient coil assembly 116, and an RF coil 118. Controller 104 includes a memory unit 120, a processor network 122 (e.g., a plurality of interconnected processors), and a display unit 124. Gradient coil assembly 116 includes a plurality of orthogonal gradient coils, such as x, y, and z gradient coils.

In an embodiment of the invention, an object 126 (e.g., a patient) to be scanned is placed on table 106. The MRI data of object 126 is obtained by scan portion 102. This is achieved by the application of a main magnetic field generated by magnet 114, a plurality of gradient magnetic fields generated by gradient coil assembly 116, and RF pulses generated by RF coil 118. In an embodiment of the invention, the main magnetic field is produced by magnet 114, where, for example, a superconducting magnet extends through the entire magnet 114 and generates a homogenous magnetic field throughout a length of magnet 114. Furthermore, the gradient magnetic field applied by set of gradient coils 116 produces a linear variation in the magnetic field along a desired direction. Thereafter, RF pulses generated by RF coil 118, in combination with the fields, excite protons in object 126. Consequently, the protons produce analog signals. The amplitudes of the analog signals are dependent on the relaxation characteristics and spin densities of the protons present in object 126.

In accordance with various embodiments of the invention, the analog signals are received by RF coil 118. RF receiver 112 converts the analog signals into readable MRI data and communicates the MRI data to controller 104 for image reconstruction. The MRI data received by controller 104 is stored in memory unit 120. In accordance with an embodiment of the invention, image reconstruction is performed by processor network 122, and the resultant image is displayed on display unit 124. In various embodiments of the invention, processor network 122 may include, for example, a set of processors that can communicate with each other, to perform image reconstruction on the MRI data.

In accordance with various embodiments of the invention, processor network 122 is configured to define and/or specify the shape of the gradient pulses produced by gradient coil assembly 116. In accordance with an alternative embodiment of the invention, processor network 122 is also used to define and/or specify the shape of the RF pulses generated by RF coil 118. The desired shape of the gradient pulses and the RF pulses are communicated by processor network 122 to gradient amplifier 108 and RF amplifier 110, respectively. The amplified gradient signals generated by gradient amplifier 108 are communicated to set of gradient coils 116. Additionally, amplified RF signals generated by RF amplifier 110 are communicated to RF coil 118. Thereafter, gradient coil assembly 116 generates the gradient magnetic field, based on signals received from gradient amplifier 108, while RF coil 118 generates the RF pulses, based on signals received from RF amplifier 110. The main magnetic field, RF pulses, and gradient pulses cause the analog signals to be generated by object 126. The analog signals are received by RF coil 118, and are further converted to readable MRI data, which is processed to generate the resultant image. The resultant image is generated and displayed on display unit 124. Further, set of gradient coil assembly 116 vibrates when the amplified gradient signals from gradient amplifier 108 are applied to gradient coil assembly 116 in the presence of the main magnetic field, thereby producing acoustic noise.

In various embodiments of the invention, memory unit 120 may be, for example, a magnetic or an optical storage media such as a hard disk, a tape drive, or a memory chip. Memory unit 120 also may be other similar devices for loading computer programs or other instructions into the computer system. Further, display unit 124 may include, for example, a cathode ray display, a LCD display, or a plasma display.

Figure 2:
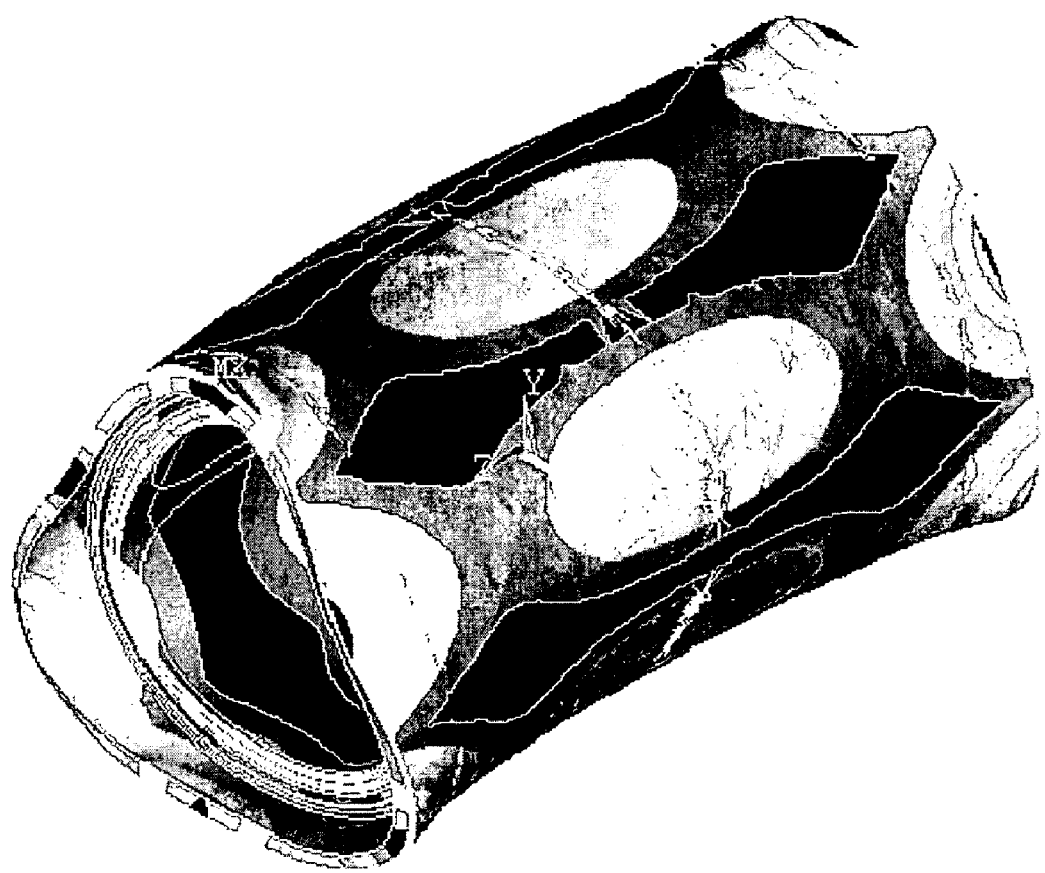
FIG. 2 is a snapshot of a cylindrical gradient coil assembly shown in a position of maximum deformation due to its vibration during operation, in accordance with an embodiment of the invention.

FIG. 2 is a snapshot of a gradient coil assembly 200, which is an example of gradient coil assembly 116 in MRI system 100, in accordance with an embodiment of the invention. The gradient coil assembly 200 includes a plurality of orthogonal x, y and z sets of gradient coils. The gradient coil assembly 200 can deform and bend by a significant amount upon receiving electrical signals as evident in FIG. 2. As soon as an electrical signal is applied to gradient coil assembly 200, gradient coil assembly 200 starts deforming and vibrating to generate acoustic noise. The vibrations of gradient coil within gradient coil assembly 200 can result in a substantially high level of acoustic noise which can reach up to 130 decibels (dB). Gradient coil assembly 200 may include at least one sensor to detect the vibrations and/or the noise. Gradient coil assembly 200 may also include at least one actuator to reduce the vibrations and acoustic noise.

Figure 3:
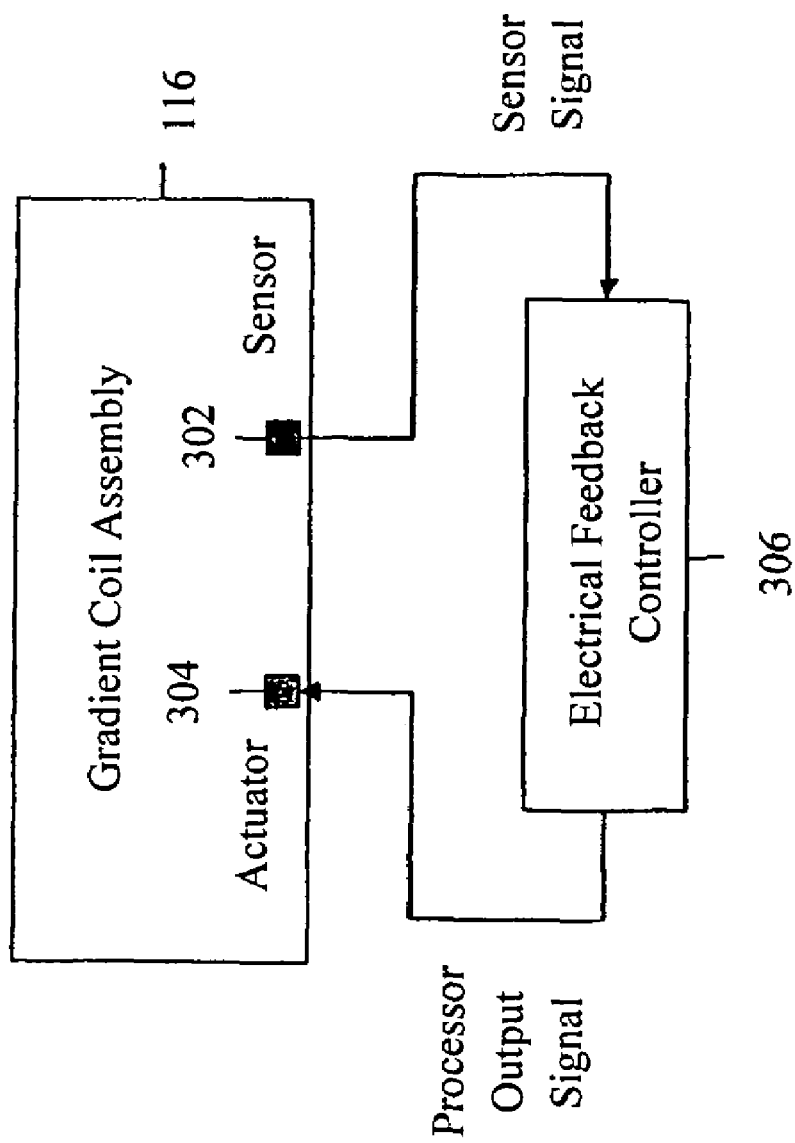
FIG. 3 is a block diagram illustrating a signal generation system, which is used to reduce acoustic noise in the MRI system, in accordance with an embodiment of the invention.

FIG. 3 is a block diagram illustrating a signal generation system 300, which is used to reduce acoustic noise in MRI system 100, in accordance with an embodiment of the invention. Signal generation system 300 is a feedback system. Gradient coil assembly 116 includes one or more sensors 302 and one or more actuators 304, hereinafter referred to as sensors 302 and actuators 304 respectively. Alternatively, gradient coil assembly 116 may not include sensors 302 and the sensors 302 are communicatively, such as wirelessly or via a wired connection, coupled to a transceiver coupled to gradient coil assembly 116. An example of sensor 302 includes an acoustic noise sensor that senses acoustic noise. The acoustic noise sensor measures acoustic noise produced by the vibrations of at least one gradient coil in gradient coil assembly 116. The acoustic noise sensor may be placed in an area where the acoustic noise is heard and/or is to be reduced. For example, the acoustic noise sensors may be placed in the vicinity of a patient's bed. As another example, the acoustic noise sensor may be placed in a room in which MRI system 100 is placed. As yet another example, the acoustic noise sensor may be placed in a room where the acoustic noise produced by gradient coil assembly 116 is heard. As still another example, the acoustic noise sensor may be placed on a floor receiving the acoustic noise produced by gradient coil assembly 116. As another example, the acoustic noise sensor may be placed on RF coil 118 communicating the RF pulses to object 126 scanned by MRI system 100. As yet another example, the acoustic noise sensor may be placed on magnet 114 generating a main magnetic field to obtain the resultant image of object 126, or on the table 106 on which object 126 is placed during a scan performed by MRI system 100. As still another example, the acoustic noise sensor is attached to at least one part, such as gradient coil assembly 116 or RF coil 118, of MRI system 100.

Another example of sensor 302 includes a vibration sensor that detects vibrations. In various embodiments of the invention, the vibration sensor is placed in close proximity with, such as attached to, the gradient coil assembly 116, to sense the vibration signals from vibrating. As an example, the vibration sensor is attached to at least one part, such as gradient coil assembly 116 or RF coil 118, of MRI system 100. Signal generation system 300 further includes an electrical feedback controller 306, also referred to as a feedback processor, that generates electrical signals to be applied to actuators 304.

Sensors 302 sense the extent of the vibration and/or acoustic noise produced by the vibration of gradient coil assembly 116 to generate a sensor signal. The sensor signal sensed by sensors 302 are supplied as an input signal to electrical feedback controller 306. Electrical feedback controller 306 receives the sensor signal to generate a processor output signal, which is output to actuators 304. For example, electrical feedback controller 306 receives the sensor signal, determines an amplitude, and phase, such as a polarity, of the sensor signal, and generates the processor output signal. Electrical feedback controller 306 calculates the processor output signal and transmits the processor output signal to actuators 304 so that the actuators 304 act, such as bend, to minimize the vibration and acoustic noise of at least one gradient coil in gradient coil assembly 116. As an example, electrical feedback controller 306 calculates the processor output signal to be of an opposite phase than a phase of sensor signal and of the same amplitude than an amplitude of the sensor signal. As another example, controller 306 calculates the processor output signal to be of an opposite phase than a phase of sensor signal and of a different amplitude than an amplitude of the sensor signal. In the example, the different amplitude of processor output signal is within 1% to 99% of the amplitude of sensor signal. A reduction in the acoustic noise and vibration results in a reduction in an amplitude of the sensor signal sensed by sensors 302.

Actuators 304 are placed on the gradient coil assembly 116 to reduce the vibration of the gradient coil assembly 116. In various embodiments of the invention, actuators 304 may be made of bending-type piezoelectric crystals. Bending-type piezoelectric crystals may be bimorph or trimorph piezoelectric crystals, which may be made of, for example, quartz, barium titanate, lead niobate, lead zirconate titanate, and so forth. In various embodiments of the invention, actuators 304 are made to vibrate in a direction of bending that is opposite to the direction of the bending vibration of the gradient coil assembly 116, thereby counteracting the vibration of the gradient coil assembly 116. In various embodiments of the invention, actuators 304 are placed in close proximity with gradient coil assembly 116, so that they bend in a direction that is opposite to the vibration of gradient coil assembly 116. In one embodiment of the invention, actuators 304 may be attached to an enclosure embedding the gradient coil assembly 116 generating a gradient magnetic field to scan object 126. The enclosure may also embed magnet 114. Optionally, the enclosure may also embed RF coil 118. In another embodiment of the invention, actuators 304 may be attached to magnet 114 that generates the main magnetic field for scanning object 126. In another embodiment of the invention, actuators 304 may be attached to RF coil 118 that communicates the RF pulses to scan object 126. In yet another embodiment of the invention, actuators 304 may be placed with other vibrating objects in MRI system 100. In another embodiment, actuators may be a memory plastic or alternatively may be a bimetallic material. Electrical feedback controller 306 may be, for example, a processor, a microprocessor, electronic devices, a microcontroller, a programmable logic controller, or combinations thereof.

Figure 4:
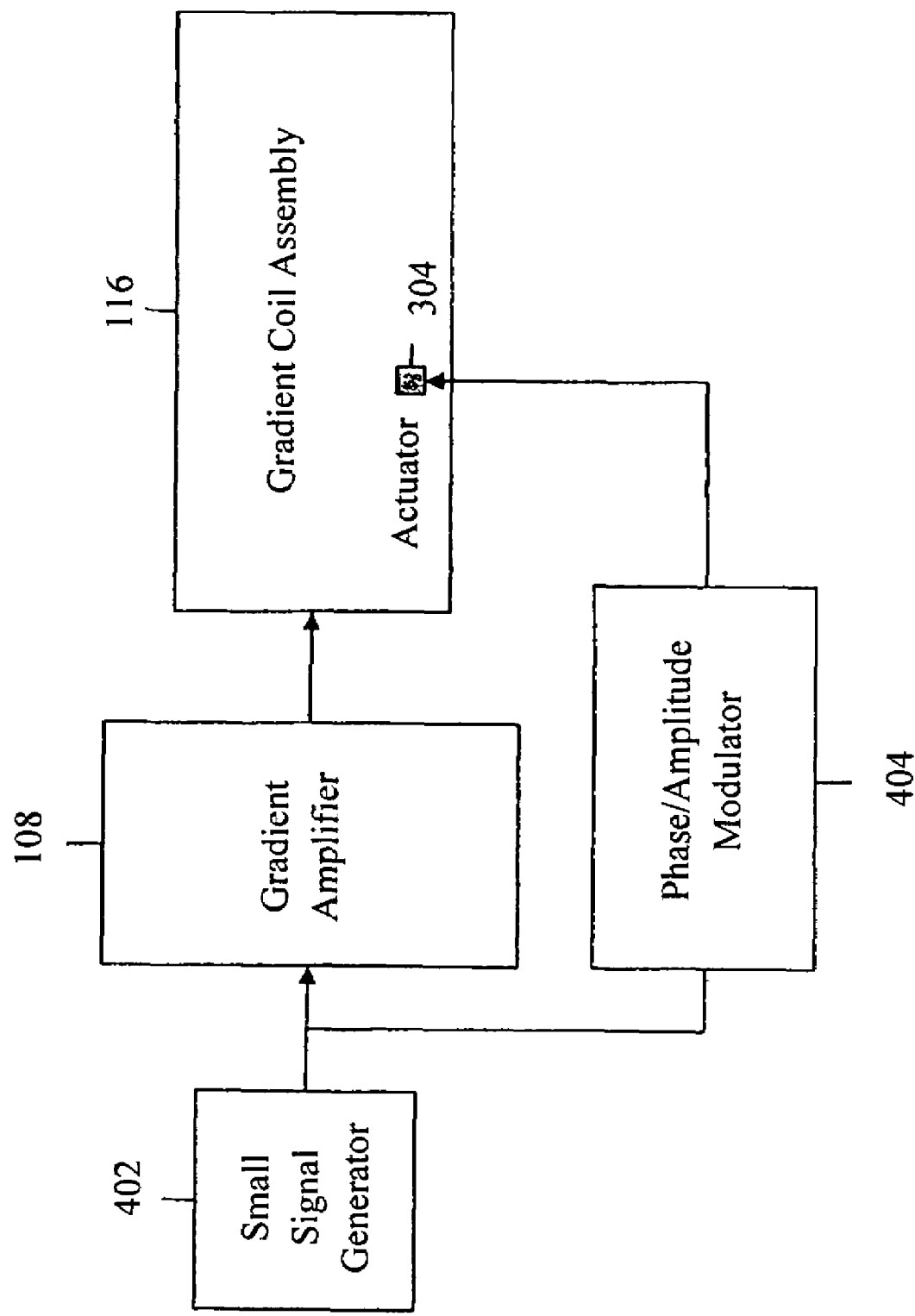
FIG. 4 is a block diagram illustrating a signal generation system, which is used to reduce acoustic noise in the MRI system, in accordance with another embodiment of the invention.

FIG. 4 is a block diagram illustrating a signal generation system 400, which is used to reduce acoustic noise in MRI system 100, in accordance with another embodiment of the invention. Signal generation system 400 is a feedforward system. Signal generation system 400 includes gradient coil assembly 116, actuators 304, a small signal generator 402, gradient amplifier 108, and a phase/amplitude modulator 404.

Small signal generator 402, such as an oscillator, generates a generator output signal that is applied to gradient coil assembly 116 after being amplified through gradient amplifier 108. Phase/amplitude modulator 404 modulates the phase and/or amplitude of generator output signal to generate a modulated output signal. The modulated output signal is provided to actuators 304.

In various embodiments of the invention, small signal generator 402 may be the analog signal generator or digital signal generator that is a part of MRI system 100. In various embodiments of the invention, the electrical signals generated by small signal generator 402 may be amplified in amplitude by gradient amplifier 108. The amplified gradient signals are applied to gradient coil assembly 116 for producing the gradient magnetic field. In various embodiments of the invention, the generator output signal from small signal generator 402 is also provided to phase/amplitude modulator 404, which modulates a phase and/or amplitude of the generator output signal. The modulated output signal is applied to actuators 304. Actuators 304 vibrate on application of the modulated output signal, in a bending direction that is opposite to the direction of the bending vibration of gradient coil assembly 116. The vibrations of actuators 304 counteract that of gradient coil assembly 116, thereby reducing the acoustic noise and vibrations generated by gradient coil assembly 116 in MRI system 100.

Various embodiments of the invention provide a method and a system that reduce the acoustic noise produced as a result of vibrations in a gradient coil. The actuators placed with the gradient coil are made to vibrate in a bending direction that is opposite to the bending direction of the vibration of the gradient coil, thereby counteracting the vibrations of the gradient coil.

A technical effect of the various embodiments of the invention is to reduce the acoustic noise produced in the MRI system.

As used herein, the term controller may include any processor-based or microprocessor-based system, such as a computer system, that includes microcontrollers, reduced instruction set circuits (RISC), application-specific integrated circuits (ASICs), logic circuits, and any other circuit or processor that is capable of executing the functions described herein. The examples given above are exemplary only, and are not intended to limit in any way the definition and/or meaning of the term controller.

The various embodiments, or the components thereof, may be implemented as a part of the computer system. The computer system may include a computer, an input device, a display unit, and an interface, for example, to access the Internet. It may also include a microprocessor, which may be connected to a communication bus. The computer may include a memory, which may include a Random Access Memory (RAM) and a Read Only Memory (ROM), as well as a storage device, which may be a hard disk drive or a removable storage drive such as a floppy disk drive, an optical disk drive, and so forth. The storage device can also be other similar means of loading computer programs or other instructions into the computer system.

The computer system executes a set of instructions that are stored in one or more storage elements, in order to process input data. The storage elements may also hold data or other information, as desired or required, and may be in the form of an information source or a physical memory element in the processing machine. The set of instructions may include various commands that instruct the computer system to perform specific operations, such as the processes of the various embodiments of the invention. The set of instructions may be in the form of a software program. The software may be in various forms, such as system software or application software. Further, the software may be in the form of a collection of separate programs, a program module within a larger program, or a portion of a program module. The software may also include modular programming in the form of object-oriented programming. The processing of input data by the processing machine may be in response to user commands, to results of previous processing, or to a request made by another processing machine.

As used herein, the terms 'software' and 'firmware' are interchangeable and include any computer program that is stored in the memory, to be executed by a computer, which includes RAM memory, ROM memory, EPROM memory, EEPROM memory, and non-volatile RAM (NVRAM) memory. The memory types mentioned above are only exemplary and do not limit the types of memory used to store computer programs.

While the invention has been described in terms of various specific embodiments, those skilled in the art will recognize that it can be practiced with modification within the spirit and scope of the claims.

What is claimed is:

1. A method for reducing acoustic noise in a medical imaging system, the method comprising:
attaching a material to an area affected by an acoustic noise generated by the imaging system, wherein the material is configured to bend on receiving an electrical signal;
receiving the acoustic noise from a sensor;
determining an amplitude and a phase of the acoustic noise;
generating, by a feedback processor, an actuator signal based on the amplitude and the phase; and
transmitting the actuator signal to the material to reduce the acoustic noise sensed by the sensor.

2. A method in accordance with claim 1 further comprising sensing, at the area, the acoustic noise from the imaging system.

3. A method in accordance with claim 1 further comprising sensing, at the area, a vibration of the imaging system by attaching at least one vibration sensor to the area.

4. A method in accordance with claim 1 further comprising sensing the acoustic noise from the imaging system by communicatively coupling an acoustic noise sensor to at least one part of the medical imaging system.

5. A method in accordance with claim 1 wherein said attaching the material comprises attaching a multimorph piezoelectric material to the area.

6. A method in accordance with claim 1 wherein said attaching the material comprises attaching at least one of a bimorph piezoelectric material and a trimorph piezoelectric material to the area.

7. A method in accordance with claim 1 wherein said attaching the material comprises affixing the material to a gradient coil of a magnetic resonance imaging system.

8. A method in accordance with claim 1 further comprising sensing a vibration from the imaging system by attaching a vibration noise sensor to at least one part of the medical imaging system.

9. A method in accordance with claim 1 further comprising:
generating, by a signal generator, a generated signal;
generating a modulated signal by modulating the generated signal; and
transmitting the modulated signal to the material to reduce the acoustic noise.

10. A method in accordance with claim 1 wherein the material comprises a memory plastic.

11. A system for reducing acoustic noise, the system comprising:
a material configured to bend upon receiving an electric signal and attached to an area that receives an acoustic noise generated by a gradient coil of an imaging system, wherein said material configured to bend upon receiving an electrical signal;
a sensor for sensing the acoustic noise to determine an amplitude and a phase of the acoustic noise; and
a feedback processor for generating an actuator signal based on the amplitude and the phase and transmitting the actuator signal to the material to reduce the acoustic noise sensed by the sensor.

12. A system in accordance with claim 11 further comprising a vibration sensor configured to sense at least one vibration from the imaging system and configured to be placed in the area.

13. A system in accordance with claim 11 further comprising an acoustic noise sensor configured to sense the acoustic noise from the imaging system and configured to he placed in the area.

14. A system in accordance with claim 11 wherein said material comprises a piezoelectric material.

15. A system in accordance with claim 11 wherein said material is attached to the gradient coil of a magnetic resonance imaging system.

16. An imaging system comprising:
a generating device configured to generate a main magnetic field;
a gradient coil configured to generate acoustic noise by interaction of a current in the gradient coil with the main magnetic field; and
a material configured to be attached to an area receiving the acoustic noise, wherein the material is configured to bend upon receiving an electrical signal, the material bending at a varying degree based on a detected amplitude and phase of the acoustic noise, the variable bending in the range of one percent to ninety-nine percent of the detected amplitude.

17. An imaging system in accordance with claim 16 further comprising a sensor configured to sense the acoustic noise from the gradient coil of the imaging system and configured to be placed in the area.

18. An imaging system in accordance with claim 16 wherein said material comprises a multimorph piezoelectric material and is attached to the gradient coil.

19. A method for reducing acoustic noise in a medical imaging system, the method comprising:
attaching a material to an area affected by an acoustic noise generated by the imaging system, wherein the material is configured to bend on receiving an electrical signal; and
sensing the acoustic noise by placing a vibration sensor in at least one of a room in which the imaging system is placed, a room receiving the acoustic noise, a floor receiving the acoustic noise, a radio frequency coil communicating radio frequency signals to an object scanned by the imaging system, a magnet generating a main magnetic field to obtain an image of the object, and a patient bed on which the object is placed during a scan performed by the imaging system.

20. A method for reducing acoustic noise in a medical imaging system, the method comprising:
attaching a material to an area affected by an acoustic noise generated by the imaging system, wherein the material is configured to bend on receiving an electrical signal, wherein said attaching the material comprises attaching the material to an enclosure embedding at least one of a gradient coil generating a gradient magnetic field scanning an object placed within the imaging system, a magnet generating a main magnetic field scanning the object, and a radio frequency coil communicating a plurality of radio frequency signals scanning the object.

* * * * *